United States Patent
Han et al.

(10) Patent No.: US 9,076,598 B2
(45) Date of Patent: Jul. 7, 2015

(54) PASTE FOR DYE-SENSITIZED SOLAR CELL, TRANSPARENT INSULATION FILM FOR DYE-SENSITIZED SOLAR CELL, DYE-SENSITIZED SOLAR CELL, AND DYE-SENSITIZED SOLAR CELL FABRICATION METHOD

(75) Inventors: Liyuan Han, Oaska (JP); Ryohsuke Yamanaka, Osaka (JP); Nobuhiro Fuke, Osaka (JP); Atsushi Fukui, Osaka (JP); Shingo Takano, Tokyo (JP); Gaku Fujihashi, Tokyo (JP)

(73) Assignees: SHARP CORPORATION, Osaka (JP); SUMITOMO OSAKA CEMENT CO., LTD., Tokyo (JP)

( * ) Notice: Subject to any disclaimer, the term of this patent is extended or adjusted under 35 U.S.C. 154(b) by 872 days.

(21) Appl. No.: 12/936,309

(22) PCT Filed: Mar. 27, 2009

(86) PCT No.: PCT/JP2009/056348
§ 371 (c)(1),
(2), (4) Date: Oct. 4, 2010

(87) PCT Pub. No.: WO2009/125686
PCT Pub. Date: Oct. 15, 2009

(65) Prior Publication Data
US 2011/0030781 A1 Feb. 10, 2011

(30) Foreign Application Priority Data
Apr. 8, 2008 (JP) ................. 2008-100109

(51) Int. Cl.
*H01L 51/46* (2006.01)
*H01G 9/20* (2006.01)
*H01B 1/12* (2006.01)
*H01L 51/00* (2006.01)
*H01L 51/42* (2006.01)

(52) U.S. Cl.
CPC ............. *H01G 9/2031* (2013.01); *H01B 1/122* (2013.01); *H01G 9/2059* (2013.01); *H01G 9/2081* (2013.01); *H01L 51/0086* (2013.01); *H01L 51/4226* (2013.01); *Y02E 10/542* (2013.01)

(58) Field of Classification Search
USPC ........... 136/263; 438/82; 252/182.11, 182.12, 252/182.3
See application file for complete search history.

(56) References Cited

U.S. PATENT DOCUMENTS

2007/0137477 A1* 6/2007 Freeman et al. ................... 95/45
2007/0256731 A1 11/2007 Hayase
2008/0202585 A1 8/2008 Yamanaka et al.

FOREIGN PATENT DOCUMENTS

EP 1 341 196 A2 9/2003
JP A-11-339866 12/1999
(Continued)

OTHER PUBLICATIONS

International Search Report issued in Patent Application No. PCT/JP2009/056348, dated Jul. 7, 2009 (with trans.).
(Continued)

*Primary Examiner* — Jayne Mershon
(74) *Attorney, Agent, or Firm* — Oliff PLC

(57) ABSTRACT

A paste containing a silica polymer, made by substituting at least some of the surface functional groups thereof with alkyl groups, and solvent-removable inorganic particles is prepared, and the paste is applied and fired to form a transparent insulating film in a dye-sensitized solar cell.

8 Claims, 1 Drawing Sheet

(56) References Cited

FOREIGN PATENT DOCUMENTS

| | | | |
|---|---|---|---|
| JP | 2003-142171 | | 5/2003 |
| JP | 2005-093307 | A | 4/2005 |
| JP | A-2005-093307 | | 4/2005 |
| JP | A-2005-228594 | | 8/2005 |
| JP | A-2006-24574 | | 1/2006 |
| JP | A-2006-100025 | | 4/2006 |
| JP | 2007-018809 | * | 1/2007 |
| JP | 2007-018809 | A | 1/2007 |
| JP | A-2007-18809 | | 1/2007 |
| JP | A-2007-35594 | | 2/2007 |
| JP | A-2009-016304 | | 1/2009 |
| WO | WO 2005/054340 A1 | | 6/2005 |
| WO | WO 2005/069424 A1 | | 7/2005 |

OTHER PUBLICATIONS

Extended European Search Report issued in European Application No. 09730288.9 dated Jul. 6, 2011.

Mar. 28, 2012 Office Action issued in European Patent Application No. 09730288.9.

Venkateswara Rao et al. "Effect of methyltrimethoxysilane as a synthesis component on the hydrophobicity and some physical properties of silica aerogels" Microporous and Mesoporous Materials 30 (1999) pp. 267-273.

Feb. 28, 2014 Office Action issued in Chinese Application No. 200980111872.2.

\* cited by examiner

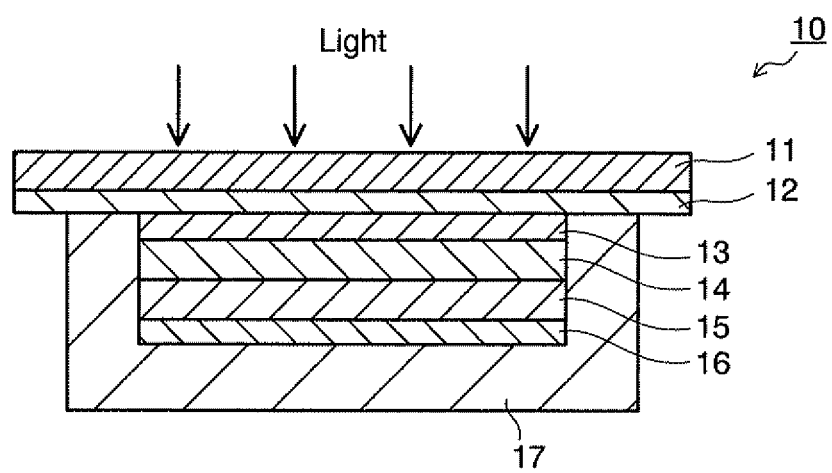

PASTE FOR DYE-SENSITIZED SOLAR CELL, TRANSPARENT INSULATION FILM FOR DYE-SENSITIZED SOLAR CELL, DYE-SENSITIZED SOLAR CELL, AND DYE-SENSITIZED SOLAR CELL FABRICATION METHOD

BACKGROUND OF THE INVENTION

1. Field of the Invention

The present invention relates to a paste for a dye-sensitized solar cell, a transparent insulation film for a dye-sensitized solar cell, a dye-sensitized solar cell, and a method of fabricating a dye-sensitized solar cell.

2. Description of Related Art

Conventionally, there is known a dye-sensitized solar cell having such a configuration that a dye-supported semiconductor layer (photoelectric conversion layer) formed of titanium oxide or the like and an electrolyte layer are provided between a transparent electrode and a counter electrode having a catalyst-supported conductive layer, and the peripheries thereof are sealed with a sealant such as a resin (for example, JP-A-2005-228594 (KOKAI)). Furthermore, there is known a dye-sensitized solar cell having a sequential stack configuration of a dye-supported semiconductor layer (photoelectric conversion layer) formed of titanium oxide or the like similarly as above, an insulating reflection layer, a catalyst layer and a conductive layer in this order on a transparent electrode (for example, JP-A-2003-142171 (KOKAI)).

Furthermore, for the purpose of realizing the enlargement of the area of a dye-sensitized solar cell, serial connection has recently been attempted between a solar battery cell (F cell) having a sequential stack of a dye-supported semiconductor layer (photoelectric conversion layer) formed of titanium oxide or the like, an insulating reflection layer, a catalyst layer and a conductive layer in this order on a transparent electrode, and a solar battery cell (R cell) having a sequential stack of a catalyst layer, a transparent insulation film, a dye-supported semiconductor layer (photoelectric conversion layer) formed of titanium oxide or the like, and a conductive layer in this order on the transparent electrode (for example, JP-A-2007-18809 (KOKAI)). In addition, the above-stated stack structure constituting an F cell and the above-stated stack structure constituting an R cell are isolated from each other by a partition wall.

In the case of a dye-sensitized solar cell constituted from an F cell and an R cell which are connected in series with one another, the light-receiving surface is set on the transparent electrode side, and a light is incident into the corresponding cells from the transparent electrode side. In order to ensure that electric power is generated by photoelectric conversion in the F cell and R cell, the above-stated incident light must reach the corresponding semiconductor layers (photoelectric conversion layers) in the corresponding cells so as to realize light absorption in the cells by means of dyes supported on the respective semiconductor layers.

In the case of the F cell, since the semiconductor layer is directly formed on the transparent electrode, a light incident from the transparent electrode side reaches the semiconductor layer relatively easily so that an intended light absorption is relatively easily carried out by the supported dye. On the other hand, in the case of the R cell, since the catalyst layer and the transparent insulation film are interposed between the transparent electrode and the semiconductor layer, a light incident from the transparent electrode side reaches the semiconductor layer through the catalyst layer and the transparent insulation film. In such an R cell, therefore, in order to enhance the light amount of the incident light reaching the semiconductor layer, it is particularly important to improve the transparency of the transparent insulation film.

In order to meet such requirement, JP-A-2007-18809 (KOKAI) secures the transparency of the transparent insulation film by rendering the transparent insulation film porous.

In the case of the above-stated R cell, the dye-supported semiconductor layer is formed after the formation of the transparent insulation film. However, the support of the dye on the semiconductor layer is carried out by dipping the semiconductor layer in a dye solution. As a result, the transparent insulation film in addition to the semiconductor layer is also dipped in the dye solution, so that the dye is also adsorbed at a certain degree into the transparent insulation film. Therefore, since the above-stated incident light is absorbed at a certain degree by the transparent insulation film, the ratio of the incident light reaching the semiconductor layer is decreased, so that the photoelectric conversion efficiency in the semiconductor layer, that is, the electric power generation efficiency of a dye-sensitized solar cell is deteriorated.

From the viewpoint of these problems, JP-A-2007-18809 (KOKAI) discloses the formation of the transparent insulation film by using fine particles, such as silicon oxide, onto which a dye is not readily adsorbed. Furthermore, the same publication discloses an attempt to form, on the surface of fine particles as a base material, a coated film made of magnesium oxide or the like soluble in an acidic solution, thereby forming the transparent insulation film using fine particles such as titanium oxide. In this case, when the transparent insulation film is dipped in the above-stated dye solution, the dye is adsorbed into the coated film, so the coated film is then dipped in the acidic solution to remove the coated film so as to eliminate the dye, thereby obtaining a transparent film.

In the transparent insulation film obtained through the dye removing process, however, the dyes adsorbed onto the soluble fine particles become useless in terms of resources. Furthermore, there has been a need for further improving the transparency by decreasing the dye adsorption amount.

Patent Reference 1: JP-A-2005-228594 (KOKAI)
Patent Reference 2: JP-A-2003-142171 (KOKAI)
Patent Reference 3: JP-A-2007-18809 (KOKAI)

SUMMARY OF THE INVENTION

An object of the present invention is to secure, in a dye-sensitized solar cell having a solar battery cell (R cell) with a sequential stack of a catalyst layer, a transparent insulation film, a dye-supported semiconductor layer (photoelectric conversion layer) made of titanium oxide or the like, and a conductive layer in this order particularly on a transparent electrode, the transparency of a transparent insulation film and to inhibit the adsorption of a dye for the transparent insulation film, thereby improving the photoelectric conversion efficiency in the semiconductor layer, that is, the electric power generation efficiency of the dye-sensitized solar cell.

Technical Solution

In order to achieve the above-stated object, the present invention relates to a paste for a dye-sensitized solar cell, containing a silica polymer, made by substituting at least some of the surface functional groups thereof with alkyl groups, and solvent-removable inorganic particles.

Furthermore, the present invention relates to a transparent insulation film for a dye-sensitized solar cell, containing a silica polymer, made by substituting at least some of the surface functional groups thereof with alkyl groups, and exhibiting porosity due to the three-dimensional binding of the silica polymer.

Furthermore, the present invention relates to a dye-sensitized solar cell including a transparent substrate, a transparent conductive layer formed on the transparent substrate, a catalyst layer formed on the transparent conductive layer, a transparent insulation film formed on the catalyst layer, the transparent insulation film being formed of a silica polymer made by substituting at least some of the surface functional groups thereof with alkyl groups and exhibiting porosity due to the three-dimensional binding of the silica polymer, a dye-adsorbed porous semiconductor layer formed on the transparent insulation film, and a conductive layer formed on the porous semiconductor layer.

Furthermore, the present invention relates to a method of fabricating a dye-sensitized solar cell, including the steps of forming a transparent conductive layer on a transparent substrate, forming a catalyst layer on the transparent conductive layer, applying a paste containing a silica polymer made by substituting at least some of the surface functional groups thereof with alkyl groups and solvent-removable inorganic particles onto the catalyst layer, followed by firing at a prescribed temperature to form an insulation film, dipping the insulation film in a solvent to dissolve and remove the inorganic particles, thereby forming a transparent insulation film exhibiting porosity due to the three-dimensional binding of the silica polymer, forming a dye-adsorbed porous semiconductor layer on the transparent insulation film, and forming a conductive layer on the porous semiconductor layer.

As a result of intensive investigations to solve the above-stated problems, the inventors of the present invention have found that the above-stated object can be accomplished by forming a transparent insulation film of a dye-sensitized solar cell using a paste containing a silica polymer made by substituting at least some of the surface functional groups thereof with alkyl groups, and solvent-removable inorganic particles.

That is, by applying the paste onto a catalyst layer composed of the solar cell and firing it at a prescribed temperature, the silica polymer functions as a binder for the inorganic particles, so that the inorganic particles composed of the paste remain in the form of particles on the catalyst layer, and the inorganic particles adjacent to one another are allowed to aggregate, thereby forming an insulation film with filling of the silica polymer therebetween.

Furthermore, since the inorganic particles are soluble in a solvent such as an acidic solution, the inorganic particles are then dissolved and removed by dipping the insulation film in the solvent. As a consequence, on the catalyst layer is formed a porous insulation film containing a large number of vacancies formed through the dissolution and removal of the inorganic particles, in a base material made of the silica polymer. That is, on the catalyst layer is formed a porous insulation film which is obtained through the three-dimensional binding of the silica polymer.

Furthermore, the porous insulation film exhibits transparency due to the porosity thereof, and becomes a so-called transparent insulation film. As used herein, the term "transparent insulation film" refers to a film having a total light transmissivity of 80% or higher, as measured using an integrating sphere, for example after filling a porous film with a liquid having a refractive index equivalent to that of silica.

Meanwhile, the silica polymer composed of the porous insulation film exhibits hydrophobicity due to having an alkyl group on the surface thereof. As a result, subsequently upon the formation of a dye-supported semiconductor layer on the porous insulation film, even when the porous insulation film together with the semiconductor layer is dipped in a given dye solution, the adsorption of the dye into vacancies of the porous insulation film does not occur. Therefore, since there is no event where the light incident on the dye-sensitized solar cell is absorbed by the dye adsorbed on the porous insulation film, the photoelectric conversion efficiency in the semiconductor layer, that is, the electric power generation efficiency of the solar cell can be improved.

Furthermore, it is possible to greatly inhibit gelation or curing of the paste even when the paste is left for a long period of time, because the silica polymer composed of the binder has alkyl groups on the surface thereof.

Furthermore, the alkyl group-substituted silica polymer is stable even at a high temperature, and can stably maintain the structure thereof, for example, even at a firing temperature of 300 to 500° C. Therefore, as described hereinbefore, when the transparent insulation film of a dye-sensitized solar cell is configured from the alkyl group-substituted silica polymer, the structure of the transparent insulation film can be stably maintained even upon the exposure to a high temperature process during the subsequent production process, and consequently the film strength thereof can be stably retained.

Furthermore, since there are a large number of hydroxyl groups on the surface of the silica polymer, the alkyl groups are attached to the surface of the silica polymer by reacting such hydroxyl groups with trialkyl silicon.

Effect of the Invention

As described above, according to the present invention, with respect to a dye-sensitized solar battery having solar battery cells (R cells) fabricated by sequential stacking of a catalyst layer, a transparent insulation film, a dye-supported semiconductor layer (photoelectric conversion layer) made of titanium oxide or the like, and a conductive layer particularly on a transparent electrode, it is possible to secure transparency of the transparent insulation film and inhibit the adsorption of a dye to the transparent insulation film, thereby improving photoelectric conversion efficiency in the semiconductor layer, that is, the electric power generation efficiency of the dye-sensitized solar cell.

BRIEF DESCRIPTION OF THE DRAWINGS

FIG. 1 is a block diagram illustrating an example of a dye-sensitized solar cell of the present invention.

EXPLANATION OF THE SYMBOLS

10: dye-sensitized solar cell, 11: transparent substrate, 12: transparent conductive layer, 13: catalyst layer, 14: transparent insulation film, 15: photoelectrode layer, 16: conductive layer, 17: sealing layer Best Mode For Carrying Out The Invention Hereinafter, details of the present invention and other features and advantages thereof will be illustrated further in detail. However, the present invention is not limited to the following embodiments.

(Paste)

A silica polymer composed of the paste of the present invention needs to substitute some of the surface functional groups thereof with alkyl groups. The alkyl group generically refers to a group with binding of (hydrogen atoms)$_{2n+1}$ to (carbon atoms)$_n$, and is preferably a lower alkyl group having 1 to X carbon atoms, such as a methyl group, an ethyl group, a propyl group or an isopropyl group. These lower alkyl groups exhibit a high binding stability for the silica polymer and thus no cleavage of the bond thereof even at a high temperature, when the surface functional groups of the silica polymer and the trialkylsilicon compound are reacted by hydrolysis through the use of an alkyl moiety of the trialkylsilicon compound such as trialkylsilicon alkoxide or trialkylsilicon chloride.

Therefore, when the paste containing such an alkyl group-substituted silica polymer is formed and a transparent insulation film is formed from the paste according to the following production method, the structure of the transparent insulation film can be stably maintained so as to stably retain the film strength thereof even when exposed to high temperature processes.

When the above-stated lower alkyl group is used, such an alkyl group stably binds to the silica polymer even at a temperature of 300 to 500° C., thereby exerting the above-stated working effects. A propyl group is heat-resistant against a temperature around 300° C. and an ethyl group is heat-resistant against a temperature around 400° C. A smaller number of carbon atoms leads to further improved heat resistance. Particularly, the use of a methyl group exhibits a high thermal stability due to the stable binding thereof to the silica polymer at a temperature of up to about 500° C.

On the other hand, when an alkyl group is used wherein a linear chain portion thereof has 4 or more carbon atoms, the carbon chain constituting the alkyl group tends to randomly cleaved when the transparent insulation film containing the silica polymer surface-substituted with such an alkyl group is placed under high temperatures. Accordingly, the silica polymer fails to have the uniform distribution of alkyl groups on the surface thereof, and the effects of substitution with alkyl groups, so that the effects of the alkyl group-substituted silica polymer may be not sufficiently exerted.

Furthermore, since a silica polymer has a large number of hydroxyl groups present on the surface thereof, a terminal group of the reaction site becomes an alkyl group through the reaction with trialkylsilicon alkoxide by hydrolysis.

Since the silica polymer exhibits hydrophobicity due to having the above-stated alkyl groups on the surface thereof, it is possible to impart hydrophobicity to the transparent insulation film made of the silica polymer, in the following production method. Therefore, even when the transparent insulation film is dipped in a dye solution, it is possible to inhibit the adsorption of the dye to the transparent insulation film.

The ratio of the alkyl group in the surface functional groups of the silica polymer is preferably in the range of 40% to 90%. If the ratio is lower than 40%, the alkyl group-substituted effects on the silica polymer are not sufficient, and when the paste containing the silica polymer is applied and fired at a prescribed temperature to form the transparent insulation film, sufficient hydrophobicity may be not imparted to the transparent insulation film. In addition, the paste may undergo gelation and curing, thus making it impossible to be used in subsequent film formation.

On the other hand, if the ratio is higher than 90%, when the paste is prepared from the silica polymer, applied and fired to form a transparent insulation film, the binding between the adjacent silica polymers is hindered, so that the effect as a binder for the inorganic particles contained in the paste may be not obtained.

The size of the silica polymer that can be used in the present invention is not particularly limited, but preferably has an average molecular weight in the range of 1000 to 4000 at polyester conversion. More preferred is 1000 to 2000. Accordingly, when a layer is formed using a paste prepared from the binder containing the silica polymer, the incorporation effects of the silica polymer can be most significantly exerted.

Furthermore, the content ratio of the silica polymer in the paste is preferably in the range of 0.1% by weight to 100% by weight in terms of post-firing weight of $SiO_2$, relative to the inorganic particles. If the content ratio is lower than 0.1% by weight, the effects of the silica polymer as a binder for the inorganic particles in the transparent insulation film may be not obtained. Furthermore, due to an absolute quantity of the silica polymer being insufficient, the transparent insulation film may be not formed as a uniform film.

On the other hand, if the content ratio is higher than 100% by weight, when the transparent insulation film is formed, the ratio of vacancies formed by dissolution and removal of the inorganic particles is decreased to result in the decrease of the porosity of the transparent insulation film, so that the transparent insulation film may not retain the transparency thereof.

Furthermore, the inorganic particles contained in the paste of the present invention need to be solvent-removable inorganic particles as described above, and examples thereof include zinc oxide particles or magnesium oxide particles, manganese oxide, nickel oxide, yttrium oxide, indium oxide, vanadium oxide, and precursors that are converted into the above-stated particles by heating. These inorganic particles can be simply and conveniently dissolved and removed, for example, by applying the paste, followed by firing at a prescribed temperature to form a given insulation film, and then dipping the insulation film in an acidic solution.

Furthermore, the acidic solution may employ an aqueous solution of an inorganic acid. Thereby, the dissolution and removal of the above-stated inorganic particles can be simply and conveniently carried out.

The size (diameter) of each of the inorganic particles is not particularly limited, as long as the transparent insulation film having a given porosity can be formed after the dissolution and removal of the inorganic particles. For example, the size (diameter) of each of the inorganic particles may be in the range of 100 nm to 10 μm. In addition, the inorganic particles do not need to be spherical particles, but may have a plate-like form, a polygonal form, or a rod-like form. With regard to these particles, the longest side in individual particles is taken to be the above-specified size.

Hereinafter, an example of a production method of the paste of the present invention will be illustrated. Firstly, for example, tetraalkyl silicon as a starting material, a catalyst such as ammonia or nitric acid, a water and an organic solvent are mixed, heated under stirring, and hydrolyzed to obtain a silica polymer. Then, trialkylsilicon alkoxide is added to the polymer solution, followed by reaction such that hydroxyl groups on the silica polymer surface are substituted by the alkyl groups to obtain an alkyl group-substituted silica polymer. Additionally, the reaction is carried out, for example, at an ice temperature, in order to prevent an excessive substitution reaction.

Next, the unreacted silica polymer not substituted with alkyl groups, the catalyst and nitric acid were removed by the addition of a pure water, followed by the purification to take out an alkyl group-substituted silica polymer only.

Next, the inorganic particles and the thus obtained alkyl group-substituted silica polymer, are substituted in a high-boiling organic solvent such as hexylene glycol or α-terpionel together with a cellulose resin, an acrylic resin or the like, thereby obtaining a desired paste.

The alkyl group-substituted silica polymer can be freeze-stored in the form of an ethanol solution with the addition of ethanol thereto over an extended period of time. This is believed to be due to the lowered polymer-polymer reactivity because the surface functional groups of the silica polymer are largely substituted by alkyl groups.

(Transparent Insulation Film, Dye-Sensitized Solar Cell and Fabrication Method of Dye-Sensitized Solar Cell)

Hereinafter, the transparent insulation film, the dye-sensitized solar cell and the fabrication method of the dye-sensitized solar cell in accordance with the present invention will be described.

FIG. 1 is a block diagram illustrating an example of a dye-sensitized solar cell of the present invention. Although FIG. 1 shows the formation of a single solar battery cell on a substrate, for the sake of clarity of features, a plurality of solar battery cells are, in fact, arranged lengthwise and crosswise.

Referring to a dye-sensitized solar cell 10 shown in FIG. 1, a transparent conductive layer 12 made of ITO or the like, a catalyst layer 13, a transparent insulation film 14, a photoelectrode layer 15 as a dye-supported semiconductor layer made of titanium oxide particles or the like, and a conductive layer 16 are sequentially formed on a transparent substrate 11 to constitute battery cells. Additionally, these battery cells are sealed by a sealing layer 17. The transparent insulation film 14 is porous as described above, and the interior thereof is impregnated with an electrolyte. The transparent insulation film 14 is formed of a hydrophobic silica polymer as described above, so there is no occurrence of dye adsorption.

In this example, a light contributing to power generation is incident, as indicated by an arrow in the drawing, from the transparent substrate 11 side. The light passes through the catalyst layer 13 and the transparent insulation film 14, and then reaches the photoelectrode layer 15 to excite the supported dye to thereby generate electrons. The electrons are transferred to the semiconductor layer constituting the photoelectrode layer 15 and accepted in the conductive layer 16. Meanwhile, the dye receives the lost electrons through an oxidation-reduction reaction in the electrolyte in the transparent insulation film 14, and the electrolyte receives electrons from the transparent conductive layer 12. Accordingly, as described above, the incidence of light from the transparent substrate 11 side leads to a flow of current within the dye-sensitized solar cell 10, thus leading to the generation of electric power.

The catalyst layer 13 is provided to promote an oxidation-reduction reaction with the electrolyte contained in the transparent insulation film 14.

The transparent substrate 11 may be formed of, for example, a flexible film made of a heat resistant light-transmissive resin such as tetraacetylcellulose (TAC), polyethylene phthalate (PET), polyphenylene sulfide (PPS), polycarbonate (PC), polyarylate (PA), polyetherimide (PEI), or a phenoxy resin, in addition to a transparent glass substrate such as quartz glass.

Examples of the material for the transparent conductive layer 12 include fluorine-doped tin oxide composite oxide (FTO), tin oxide ($SnO_2$), zinc oxide (ZnO), and the like, in addition to the above-stated ITO. The catalyst layer 13 may be formed of at least one element selected from the group consisting of Pt, Au, Ru, Os, Ti, Ni, Cr, Cu, Ag, Pd, In, Zn, Mo, Al, Ir, Co and C (simple substances, alloys or compounds thereof).

The photoelectrode layer 15 is formed of semiconductor fine particles as a base material, with the dye being supported thereon. Examples of the semiconductor fine particles include $TiO_2$, ZnO, $WO_3$, $Nb_2O_5$, $TiSrO_3$, $SnO_2$, and the like, among which $TiO_2$ is particularly preferred. The kinds of the semiconductors are not limited to the just-mentioned ones, and they may also be used in mixture of two or more thereof.

The particle diameter of the semiconductor fine particles is not particularly limited, but is preferably in the range of 1 to 200 nm in terms of average particle diameter of primary particles, and particularly preferably 5 to 100 nm.

As the dye, any dye that shows a sensitizing action can be used without any particular limitation. Examples of the dye include xanthene dyes such as Rhodamine B, Rose Bengal, eosin and erythrosine, cyanine dyes such as quinocyanine and cryptocyanine, alkaline dyes such as phenosafranin, Capri Blue, thiocine and Methylene Blue, and porphyrin compounds such as chlorophyll, zinc-porphyrin and magnesium-porphyrin. Other examples include azo dyes, phthalocyanine compounds, coumarin compounds, merocyanine compounds, Ru bipyridine complex compounds, anthraquinone dyes, polycyclic quinone dyes, and the like. Among these, the Ru bipyridine complex compounds are particularly preferable in terms of high quantum yield. However, the dye is not limited thereto. These dyes may be used alone or as a mixture of two or more thereof.

The conductive layer 16 may be formed of platinum, gold, silver, copper, aluminum, nickel, titanium, carbon, or the like. When the conductive layer material is corrosive to an electrolyte, a material having corrosion resistance is preferred. The sealing layer 17 may be formed of a thermosetting resin, a glass frit, or the like.

The transparent insulation film 14 is formed of a porous insulation film in which silica polymers, made by substituting at least some of the surface functional groups thereof with alkyl groups, are connected in a three-dimensional manner, as described above.

As the electrolyte, a combination of iodine ($I_2$) with a metal iodide or an organic iodide and a combination of bromine ($Br_2$) with a metal bromide or an organic bromide can be used. Also usable are metal complexes such as ferrocyanate/ferricyanate and ferrocene/ferricinium ion, various pyridine metal complexes including bipyridine and terpyridine, sulfur compounds such as sodium polysulfide and alkyl thiol/alkyl disulfide, viologen dyes, hydroquinone/quinone, etc.

The transparent conductive layer 12 is formed, for example, by depositing the above-stated material on the transparent substrate 11 by using a known film formation technique such as a sputtering method. Similarly, the catalyst layer 13 is formed by depositing the above-stated material on the transparent conductive layer 12 by using a known film formation technique such as a sputtering method, a spray method, or a vapor deposition method.

The transparent insulation film 14 is formed by applying the paste on the catalyst layer 13, followed by firing at a prescribed temperature to form an insulation film, and then dipping the insulation film in a solvent such as an acidic solution to dissolve and remove inorganic particles in the insulation film.

The photoelectrode layer 15 is formed as follows. Powders or a sol of the semiconductor fine particles is uniformly dispersed in a solvent such as a water to prepare a paste. The paste is applied onto the transparent insulation film 14, followed by firing at a prescribed temperature to form a layer made of the semiconductor fine particles. The thus prepared layer is dipped in a solution containing the above-stated dye so that the dye is supported on the surface of the semiconductor fine particles.

When the semiconductor fine particle layer is dipped in the dye solution, the transparent insulation film 14 is also dipped in the dye solution. However, the transparent insulation film 14 is formed of a silica polymer having surface alkyl groups, thus exhibiting hydrophobicity, so it is possible to prevent the adsorption of the dye into the transparent insulation film 14, particularly vacancies thereof. Therefore, even when a light is incident on the dye-sensitized solar cell 10 shown in FIG. 1, the light reaches the photoelectrode layer 15 without being absorbed in the transparent insulation film 14. As a consequence, the photoelectric conversion efficiency in the photoelectrode layer 15, that is, the electric power generation efficiency in the dye-sensitized solar cell 10 can be improved.

EXAMPLES

Hereinafter, the present invention will be described in more detail by way of Examples.

Example 1

A film was formed on a glass by applying an ink of 20% by weight of a methyl group-modified silica polymer, 20% by weight of zinc oxide particles, 55% by weight of terpineol and 50% by weight of ethyl cellulose by screen printing, dried at 150° C., and fired at a temperature of 500° C. to obtain a composite film. The composite film was dipped in 0.1 mol/L of hydrochloric acid to dissolve zinc oxide particles, thus making the methyl group-modified silica film porous. Into the resulting composite film was dipped a Ru metal complex dye (N719), and the colorability was evaluated by UV-VIS. As a result, the methyl group-modified silica film exhibited substantially no coloration and no adsorption of a dye.

Comparative Example 1

20 nm magnesium oxide particles and 30 nm zirconium oxide particles were mixed in a ratio of 10:100 to prepare a paste having a total solid content of 18%. The paste was applied onto glass, dried at 150° C., and fired at a temperature of 500° C. to obtain a composite film. Into the resulting composite film was dipped a Ru metal complex dye (N719). The dye-adsorbed composite film was dipped in 0.1 mol/L of hydrochloric acid to dissolve magnesium oxide particles, thus making the zirconium oxide film porous. According to UV-VIS investigation of the coloration degree, it was found that the dye was adsorbed on zirconium oxide and no removal of the dye occurred.

Comparative Example 2

20 nm magnesium oxide particles and 30 nm zirconium oxide particles were mixed in a ratio of 100:100 to prepare a paste having a total solid content of 18%. The paste was applied onto glass, dried at 150° C., and fired at a temperature of 500° C. to obtain a composite film. Into the resulting composite film was dipped a Ru metal complex dye (N719). The dye-adsorbed composite film was dipped in 0.1 mol/L of hydrochloric acid to dissolve magnesium oxide particles, thus making the zirconium oxide film porous. As a result, the film was completely peeled off.

Comparative Example 3

A magnesium acetylacetone complex and 30 nm zirconium oxide particles were mixed in a ratio of 10:100 at oxide conversion to prepare a paste having a total solid content of 18%. The paste was applied onto a glass, dried at 150° C., and fired at a temperature of 500° C. to obtain a composite film. Into the resulting composite film was dipped a Ru metal complex dye (N719). The dye-adsorbed composite film was dipped in 0.1 mol/L of hydrochloric acid to dissolve the thus obtained magnesium oxide film, thus making the zirconium oxide film porous. According to UV-VIS investigation of the coloration degree, it was found that the dye was adsorbed on zirconium oxide and no removal of the dye occurred.

TABLE 1

| | Film formation | Dye non-adsorption property |
|---|---|---|
| Example 1 | ○ | ○ |
| Comparative Example 1 | ○ | X |
| Comparative Example 2 | X | — |
| Comparative Example 3 | Δ (crack) | X |

Example 2

A film was formed on a glass by applying an ink of 20% by weight of a methyl group-modified silica polymer, 20% by weight of zinc oxide particles, 55% by weight of terpineol and 50% by weight of ethyl cellulose by screen printing, dried at 150° C., and a paste of titanium oxide nanoparticles was applied and printed thereon, followed by firing at a temperature to obtain a laminate film. The laminate film was dipped in 0.1 mol/L of hydrochloric acid to dissolve the zinc oxide particles, thus making the methyl group-modified silica film porous. Into the resulting composite film was dipped a Ru metal complex dye (N719). Adsorption of the dye was confirmed in the titanium oxide portion. In addition, similar to Example 1, the methyl group-modified silica film exhibited no adsorption of the dye and was found to be a transparent film.

Comparative Example 4

20 nm magnesium oxide particles and 30 nm zirconium oxide particles were mixed in a ratio of 10:100 to prepare a paste having a total solid content of 18%. The paste was applied onto a glass, dried at 150° C., and fired at a temperature of 500° C. Then, a paste of titanium oxide nanoparticles was applied and printed thereon, followed by firing to obtain a laminate film. Into the resulting composite film was dipped an Ru metal complex dye (N719). Then, the laminate film was dipped in 0.1 mol/L of hydrochloric acid to dissolve the thus obtained magnesium oxide particles, thus making an attempt at dye removal. As a result, the adsorption of the dye was confirmed in the titanium oxide portion, but similar to Comparative Example 1, the adsorption of the dye was also confirmed in the zirconium oxide layer.

As described above, in Examples 1 and 2 and Comparative Examples 1 to 4, according to the present invention, by the configuration in a manner where a transparent insulation film composed of a dye-sensitized solar cell is formed from a paste containing a silica polymer, made by substituting at least some of the surface functional groups thereof with alkyl groups, and solvent-removable inorganic particles, and the silica polymer is connected in a three-dimensional manner, it was demonstrated that the transparent insulation film exhibits no adsorption of the dye thereon due to the hydrophobicity of the silica polymer even when it is dipped in a dye solution, upon the subsequent formation of a photoelectrode layer.

Example 3

An isopropyl alcohol (IPA) solution of chloroplatinic acid was applied onto a transparent conductive glass, followed by firing at a temperature of 450° C. to form a transparent catalyst film. Then, an ink of 20% by weight of a methyl group-modified silica polymer, 20% by weight of zinc oxide particles, 55% by weight of terpineol and 50% by weight of ethyl cellulose was applied by screen printing to form a film which was then dried at 150° C. Thereafter, a titanium oxide nanoparticle paste serving as a photoelectric conversion film (semiconductor porous film and adsorbed dye) and a conductive film were similarly applied, printed, and fired to obtain a laminate film. The laminate film was dipped in 0.1 mol/L of hydrochloric acid to dissolve zinc oxide particles, thus making the methyl group-modified silica film porous. Into the resulting composite film was dipped a Ru metal complex dye (N719), and the titanium oxide porous film was used as a photoelectric conversion film. After sealing with a thermoplastic resin, an electrolyte solution was injected into the film structure and the injection port was sealed to fabricate a photoelectric conversion device. As a result, the photoelectric conversion device exhibited a high Jsc value and a relatively high FF value, thus showing good photoelectric conversion characteristics.

Comparative Example 5

An IPA solution of chloroplatinic acid was applied onto a transparent conductive glass, followed by firing at a temperature of 450° C. to form a transparent catalyst film. Then, 20 nm magnesium oxide particles and 30 nm zirconium oxide particles were mixed in a ratio of 10:100 to prepare a paste having a total solid content of 18%. The paste was applied and fired at a temperature of 500° C. Thereafter, a titanium oxide nanoparticle paste and a conductive film were similarly applied, printed and fired respectively to obtain a laminate film. The laminate film was dipped in a Ru metal complex dye (N719), and the titanium oxide porous film was used as a photoelectric conversion film. The laminate film was dipped in 0.1 mol/L of hydrochloric acid to dissolve magnesium oxide particles to make an attempt at removing the dye from the zirconium oxide layer. The resulting treated film was sealed with a thermoplastic resin, and an electrolyte solution was injected therein, followed by sealing of the injection port to fabricate a photoelectric conversion device. As a result, a current in the photoelectric conversion device was significantly decreased. In addition, the FF value and the photoelectric conversion efficiency were found to be extremely low.

This is because an amount of light reaching the photoelectric conversion film is decreased due to the absorption of the incident light by the dye adsorbed into the zirconium oxide layer.

Example 4

A photoelectric conversion device was fabricated and investigated in the same manner as in Example 1, except that the methyl group-modified silica polymer was changed to an ethyl group-modified silica polymer, and the firing temperature was 400° C. As a result, the photoelectric conversion device exhibited a high Jsc value and a relatively high FF value, thus showing good photoelectric conversion characteristics.

Example 5

A photoelectric conversion device was fabricated and investigated in the same manner as in Example 1, except that the methyl group-modified silica polymer was changed to a propyl group-modified silica polymer, and the firing temperature was 300° C. As a result, the photoelectric conversion device exhibited a relatively high Jsc value and a relatively high FF value, thus showing good photoelectric conversion characteristics.

TABLE 2

|  | Jsc | FF | Eff |
| --- | --- | --- | --- |
| Example 3 | ◎ (17 mA/cm$^2$) | ◎ (0.71) | ◎ (8%) |
| Example 4 | ◎ (15 mA/cm$^2$) | ○ (0.68) | ○ (7%) |
| Example 5 | ○ (14 mA/cm$^2$) | ○ (0.65) | ○ (6%) |
| Comparative Example 5 | X (10 mA/cm$^2$) | △ (0.58) | X (3%) |

While the present invention has been described in detail by way of specific embodiments, the invention is not limited thereto and various alterations or modifications are possible, without departing from the scope of the invention.

What is claimed is:

1. A paste for a dye-sensitized solar cell, comprising:
   a silica polymer, having alkyl groups that are substituted for at least some surface functional groups thereof, and solvent-removable inorganic particles,
   wherein the ratio of the alkyl groups in the surface functional groups of the silica polymer is in a range of 40% to 90%.

2. The paste for a dye-sensitized solar cell according to claim 1, wherein the alkyl group is at least one selected from the group consisting of a methyl group, an ethyl group, a propyl group, and an isopropyl group.

3. The paste for a dye-sensitized solar cell according to claim 2, wherein a content ratio of the silica polymer in the paste is in a range of 0.1% by weight to 100% by weight in terms of a weight of $SiO_2$ relative to the inorganic particles.

4. The paste for a dye-sensitized solar cell according to claim 1, wherein a content ratio of the silica polymer in the paste is in a range of 0.1% by weight to 100% by weight in terms of a weight of $SiO_2$ relative to the inorganic particles.

5. A transparent insulation film for a dye-sensitized solar cell, comprising a silica polymer having alkyl groups that are substituted for at least some surface functional groups thereof,
   wherein the silica polymer exhibits porosity due to a three-dimensional binding of the silica polymer, and
   wherein the ratio of the alkyl groups in the surface functional groups of the silica polymer is in a range of 40% to 90%.

6. A dye-sensitized solar cell, comprising:
   a transparent substrate,
   a transparent conductive layer formed on the transparent substrate,
   a catalyst layer formed on the transparent conductive layer,
   a transparent insulation film formed on the catalyst layer, the transparent insulation film being formed of a silica polymer having alkyl groups that are substituted for at least some surface functional groups thereof and exhibiting porosity due to three-dimensional binding of the silica polymer, wherein the ratio of the alkyl groups in the surface functional groups of the silica polymer is in a range of 40% to 90%,
   a dye-adsorbed porous semiconductor layer formed on the transparent insulation film, and
   a conductive layer formed on the porous semiconductor layer.

7. A method of fabricating a dye-sensitized solar cell, comprising:
   forming a transparent conductive layer on a transparent substrate, forming a catalyst layer on the transparent conductive layer, applying a paste containing a silica polymer having alkyl groups that are substituted for at least some surface functional groups thereof and solvent-removable inorganic particles onto the catalyst layer, followed by firing to form an insulation film, wherein the ratio of the alkyl groups in the surface functional groups of the silica polymer is in a range of 40% to 90%, dipping the insulation film in a solvent to dissolve and remove the inorganic particles, thereby forming a transparent insulation film exhibiting porosity due to three-dimensional binding of the silica polymer, forming a dye-adsorbed porous semiconductor layer on the transparent insulation film, and forming a conductive layer on the porous semiconductor layer.

8. The method of fabricating a dye-sensitized solar cell according to claim 7, wherein the solvent is an inorganic acid.

* * * * *